United States Patent
Onishi et al.

(10) Patent No.: US 6,903,800 B2
(45) Date of Patent: Jun. 7, 2005

(54) FILM-PROCESSING METHOD AND FILM-PROCESSING APPARATUS

(75) Inventors: Tadashi Onishi, Nirasaki (JP); Manabu Hama, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/739,019

(22) Filed: Dec. 19, 2003

(65) Prior Publication Data

US 2004/0131351 A1 Jul. 8, 2004

(30) Foreign Application Priority Data

Dec. 24, 2002 (JP) ........................................ 2002-371587

(51) Int. Cl.[7] .............................................. G03B 27/42
(52) U.S. Cl. ............................ 355/53; 355/67; 355/68; 355/77; 250/492.2; 430/30; 430/311
(58) Field of Search ............................. 355/53, 67, 68, 355/77; 430/30, 311; 250/492.2

(56) References Cited

U.S. PATENT DOCUMENTS 5,032,217 A * 7/1991 Tanaka ........................ 134/153
5,332,464 A * 7/1994 Namose .......................... 438/9
5,723,236 A * 3/1998 Inoue et al. .................... 430/5

FOREIGN PATENT DOCUMENTS

JP          3-016125       *  1/1991

* cited by examiner

Primary Examiner—D. Rutledge
(74) Attorney, Agent, or Firm—Smith, Gambrell & Russell, LLP (57) ABSTRACT

A film-processing method according to the present invention includes: a processing step of irradiating electron beams onto a film on a surface of an object to be processed to conduct a process to the film; an electric-current measuring step of capturing the electron beams in a vicinity of the object to be processed to measure an electric-current value during the processing step; and a detecting step of detecting an end point of the process to the film, based on an amount of electron obtained by means of a time integration of the electric-current value. According to the present invention, a suitable irradiation of the electron beams onto the film on a surface of the object to be processed can be realized. Thus, a suitable film quality can be obtained.

17 Claims, 12 Drawing Sheets

FILM-PROCESSING METHOD AND FILM-PROCESSING APPARATUS

FIELD OF THE INVENTION

The present invention relates to a film-processing method and a film-processing apparatus. More particularly, it pertains to a film-processing method and a film-processing apparatus which are capable of optimally processing a film such as an insulation film between layers on a surface of an object to be processed, e.g., a wafer.

BACKGROUND OF THE INVENTION

In accordance with greater integration and increased speed of semiconductor devices, wiring patterns have been miniaturized, and the reduction of parasitic capacitance generated by an insulation film between wirings has become increasingly important. In order to reduce parasitic capacitance generated by an insulation film between wirings of a minute wiring pattern, various organic materials of low dielectric constant have been developed in recent years. These organic materials have been used to form an insulation film between layers and a protective film as a Low-k material. This Low-k film material is known to form an SOD film by applying the same to a surface of an object to be processed by means of a spin coater and baking furnace. However, many of the SOD films are made of an organic material, and some of the SOD films are inferior in mechanical strength. This is because a high porosity is employed to obtain a low dielectric constant. Thus, an electron beam processing apparatus has been used to try to modify qualities of the SOD film, such as enhancing mechanical strength, while maintaining a low dielectric constant thereof.

An electron beam processing apparatus irradiates electron beams from a plurality of electron beam tubes onto a surface of an object to be processed such as a wafer to modify and cure a film such as an SOD film on the surface of the object to be processed. Such modification and curing is referred to as an "EB cure" below. The EB cure is carried out by setting processing conditions (process time, for example) of the electron beam processing apparatus, with reference to back data previously obtained by evaluating a film of the same kind.

In modifying a film quality by using a conventional electron beam processing apparatus, even when processing conditions such as a process time of the electron beam processing apparatus are set based on a previous evaluation, it is difficult to achieve the most suitable process time because of an uniform amount of irradiation of electron beams onto an object to be processed. That is, even with the same process time, the amount of electron irradiated onto an object to be processed may be either too much or too little. Thus, it is difficult for a film on a surface of the object to be processed to obtain a desired film quality, which results in a reduction of throughput. For example, if a process time for the EB cure is insufficient, curing is not completed and a desired film strength cannot be achieved. Thus, a suitable film quality cannot be obtained. On the other hand, an excess processing time for the EB cure degrades the k value, and thus a suitable film quality cannot be obtained.

SUMMARY OF THE INVENTION

The present invention is made to solve the above disadvantages. It is an object of the present invention to provide a film-processing method and a film-processing apparatus wherein electron beams are suitably irradiated onto an object to be processed to obtain a suitable film quality.

The present invention is a film-processing method comprising: a processing step of irradiating electron beams onto a film on a surface of an object to be processed to conduct a process to the film; an electric-current measuring step of capturing the electron beams in a vicinity of the object to be processed to measure an electric-current value during the processing step; and a detecting step of detecting an end point of the process to the film, based on an amount of electron obtained by means of a time integration of the electric-current value.

According to the present invention, by detecting an end point of the process to the film based on an amount of electron during the process, a suitable irradiation of the electron beams onto the film on a surface of the object to be processed can be realized. Thus, a suitable film quality can be obtained.

An amount of irradiation of the electron beams onto the film is preferably controlled by a grid electrode during the processing step.

The method according to the present invention preferably further comprises a calculating step of previously calculating an amount of electron captured before an end point of a process to a reference film on an object to be processed, as a reference amount of electron; wherein the detecting process detects the end point of the process to the film, based on the reference amount of electron.

The detecting step preferably detects the end point of the process to the film, based on a temperature of a holding member which holds the object to be processed, or a temperature of the object to be processed.

The present invention is a film-processing apparatus comprising: a processing unit which irradiates electron beams onto a film on a surface of an object to be processed to conduct a process to the film; an electric-current sensor which captures the electron beams as an electric-current in a vicinity of the object to be processed; an electric-current measuring unit which measures an electric-current value of the electric-current captured by the electric-current sensor; a calculating unit which calculates an amount of electron by means of a time integration of the electric-current value; and a detecting unit which detects an end point of the process to the film, based on the amount of electron.

According to the present invention, by detecting an end point of the process to the film based on an amount of electron during the process, a suitable irradiation of the electron beams onto the film on a surface of the object to be processed can be realized. Thus, a suitable film quality can be obtained.

The film-processing apparatus preferably further comprises a grid electrode which controls an amount of irradiation of the electron beams onto the film.

The apparatus according to the present invention preferably further comprises: a storing unit which stores a reference amount of electron captured before an end point of a process to a reference film on an object to be processed; wherein the detecting unit is adapted to detect the end point of the process to the film, based on the reference amount of electron.

The detecting unit is preferably adapted to detect the end point of the process to the film, based on a temperature of a holding member which holds the object to be processed, or a temperature of the object to be processed.

The film-processing apparatus preferably further comprises: a processing container; a stage disposed in the processing container; and a plurality of electron beam tubes which irradiate electron beams onto an object to be processed mounted on the stage.

BEST MODE FOR EMBODYING THE INVENTION

The present invention is described below with reference to embodiments thereof shown in the accompanied drawings.

Figure 1:
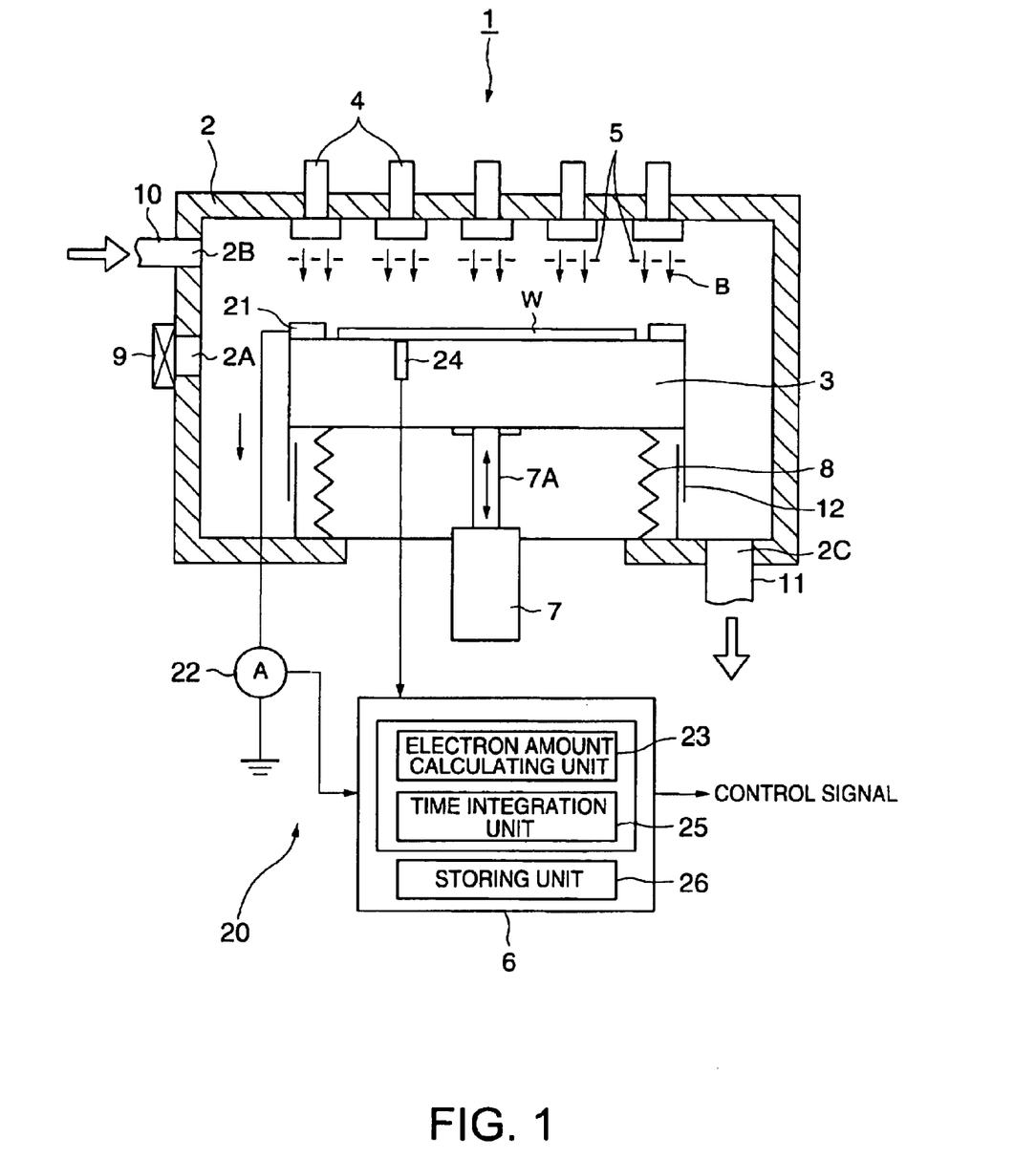
FIG. 1 is a cross-sectional view schematically showing an embodiment of a film-processing apparatus according to the present invention.

Referring FIG. 1, an embodiment of the film-processing apparatus according to the present invention is described.

Figure 2:
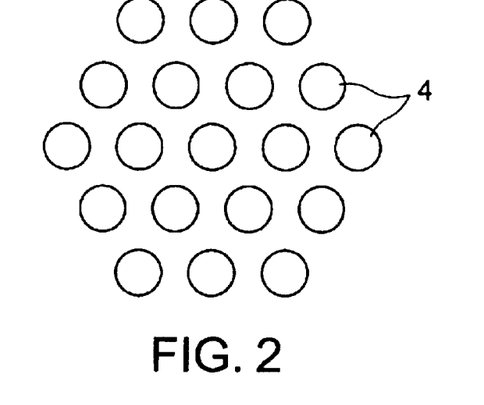
FIG. 2 is a plan view showing an example of an arrangement of electron beam tubes of the film-processing apparatus shown in FIG. 1.

As shown in FIGS. 1 and 2, a film-processing apparatus 1 of the embodiment, for example, includes a decompressible processing container 2 made of aluminum or the like; a stage 3 on which an object to be processed (wafer) W is mounted, the stage 3 being disposed on a center of a bottom surface of the processing container 2; a plurality of (e.g., 19) electron beam tubes 4 which are concentrically arranged on an upper surface of the processing container 2 opposed to the stage 3; and a grid electrode 5 which controls an amount of irradiation of electron beams B from the electron beam tubes 4. Under a control by a controller 6, the electron beams B are irradiated from the respective electron beam tubes 4 onto the whole surface of the wafer W mounted on the stage 3 so as to modify qualities of a coated insulation film (referred to as "SOD film" hereinafter) formed on the surface of the wafer W. The SOD film is formed of an organic material including elements such as Si, O, C, and H as ingredients. The film formed on the surface of the wafer W is not limited to the SOD film. The film may be other one used as an insulation film between layers or a protective film. A modification of qualities of the film by means of the electron beams is hereinbelow referred to as "EB cure" as needed.

An elevating mechanism 7 is connected to a lower surface of the stage 3. The stage 3 is vertically moved by means of a ball screw 7A of the elevating mechanism 7. The lower surface of the stage 3 and the bottom surface of the processing container 2 are connected to each other by an extensible bellows 8 made of stainless steel. Thus, an inside of the processing container 2 is air-tightly held. A port 2A through which the wafer W is loaded and unloaded is formed on a peripheral surface of the processing container 2. A gate valve 9 is attached to the port 2A, which can open and close the port 2A. A gas supply port 2B is formed on a part above the port 2A of the processing container 2. A gas exhaust port 2C is formed on the bottom surface of the processing container 2. A gas supply source (not shown) is connected to the gas supply port 2B through a gas supply pipe 10. A vacuum exhaust system (not shown) is connected to the gas exhaust port 2C through a gas exhaust pipe 11. In FIG. 1, the reference number 12 indicates a bellows cover.

The stage 3 has a heater (not shown). The wafer W is heated by the heater to a desired temperature. As shown in FIG. 2, the nineteen electron beam tubes 4 are constituted by, for example, one electron beam tube 4 positioned at a center of the upper surface of the processing container 2, six electron beam tubes 4 surrounding the central electron beam tube 4, and twelve electron beam tubes 4 surrounding the six electron beam tubes 4. Each electron beam tube 4 has a window disposed in the processing container 2, the window transmitting an electron beam. The transmitting window is encapsulated by a transparent quartz glass. The grid electrode 5 is opposingly disposed below the transmitting window.

As shown in FIG. 1, the film-processing apparatus (electron beam processing apparatus) 1 includes an end point detecting unit 20. The end point detecting unit 20 detects an end point of an EB cure of the SOD film on the surface of the wafer W. The end point detecting unit 20 has: an electric-current sensor 21 which is disposed on the upper surface of the stage 3 to surround the wafer W, the electric-current sensor 21 capturing the electron beams from the electron beam tubes 4 in a vicinity of the wafer W; an electric-current measuring unit (e.g., ammeter) 22 which is connected to the electric-current sensor 21; an electron amount calculating unit 23 which integrates a value measured by the ammeter 22 by time so as to calculate an amount of electron captured by the electric-current sensor 21; and a storing unit 26 which stores the calculated amount of electron. The electric-current sensor 21 is formed of such material that can capture the electron beams from the electron beam tubes 4. For example, a conductor such as metal and/or a semiconductor such as Si may be used for the electric-current sensor 21. The end point detecting unit 20 further has a temperature sensor 24 which measures a temperature of the stage 3, and a time integration unit 25 which integrates a value measured by the temperature sensor 24 by time. Thus, the end point detecting unit 20 can indirectly calculate a total amount of heat absorbed by the wafer W.

Figure 3A:
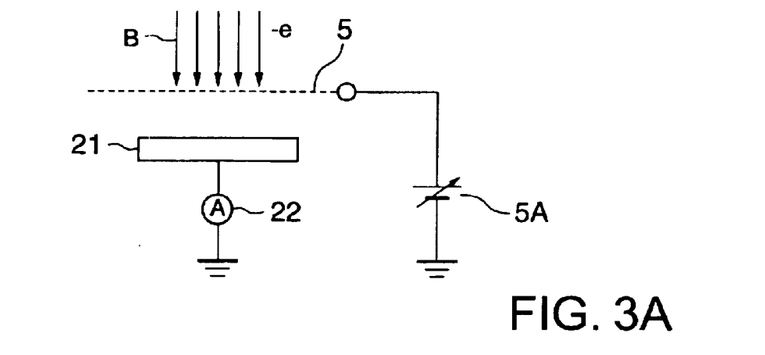
FIGS. 3A to 3C are explanatory views illustrating a principal of detecting an end point of a film process by using the film-processing apparatus shown in FIG. 1.

FIGS. 3A to 5 are explanatory views illustrating a principal of measurement by the end point detecting device 20. As shown in FIG. 3A, an amount of irradiation of the electron beams B from the electron beam tubes 4 (see, FIG. 1) is controlled by the grid electrode 5. After the irradiation amount is controlled, the electron beams B are captured by the electric-current sensor 21. The ammeter 22 measures the sensor current from the electric-current sensor 21. Based on the electric-current value, an amount of electron incident on the electric-current sensor 21 from the electron beam tubes 4 can be quantitatively measured. Thus, although indirectly, an amount of electron incident on the wafer W positioned inside the electric-current sensor 21 can be quantitatively measured.

Figure 3B:
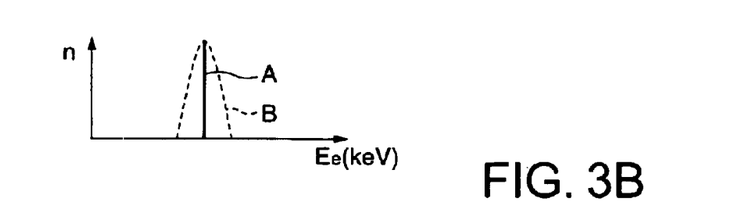
Figure 3C:
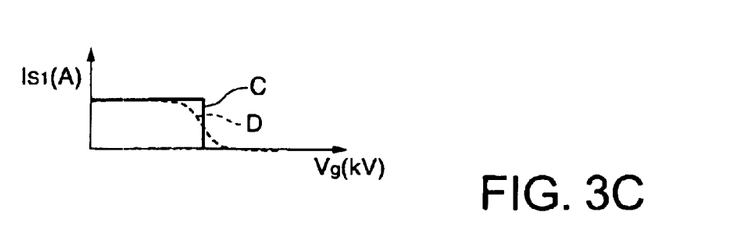

It is considered that electron irradiated from the electron beam tubes 4 does not have a constant energy value shown by the solid line A in FIG. 3B, but has an energy distribution of a certain width shown by the dotted line B in FIG. 3B, by a voltage applied to the electron beam tubes 4. Thus, when a voltage of the grid electrode 5 is increased, as shown in FIG. 3C, the electron beams are blocked by the grid electrode 5 at a predetermined grid voltage Vg. That is, the electron beams do not reach the electric-current sensor 21, and then the electric-current value becomes zero. At this time, it is not considered that the electric-current value becomes abruptly zero from a certain electric-current value as shown by the solid line C in FIG. 3C. However, as shown by the dotted line D in FIG. 3C, it is considered that the electric-current value gradually decreases to zero, according to a distribution of the number of electron shown by the dotted line B in FIG. 3B.

Figure 4:
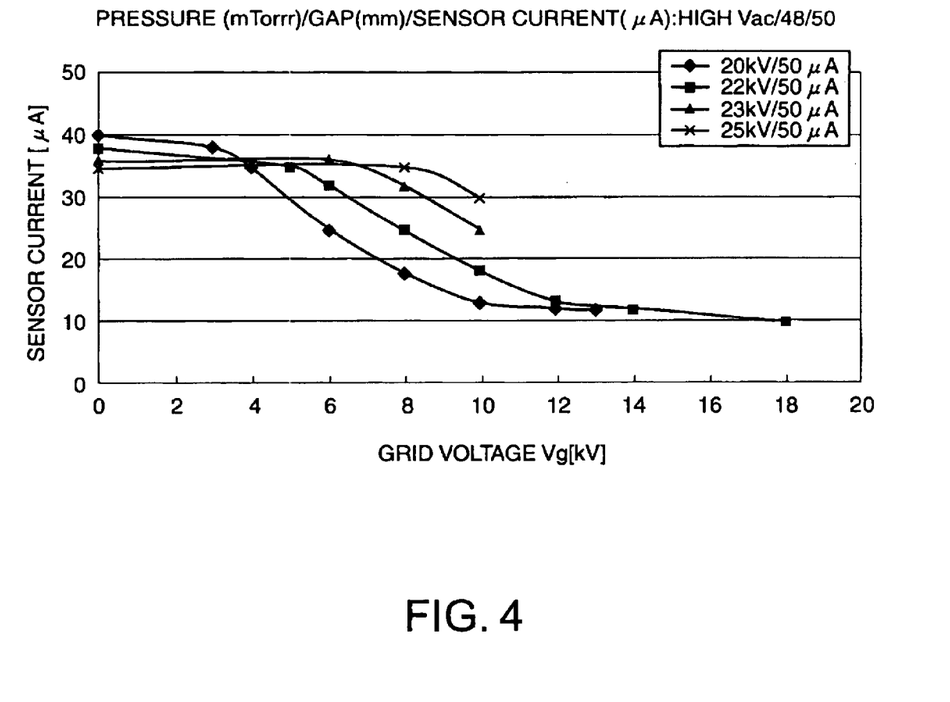
FIG. 4 is a graph showing a relationship of a voltage of a grid electrode and a sensor current flowing through an electric-current sensor shown in FIG. 1.
Figure 5A:
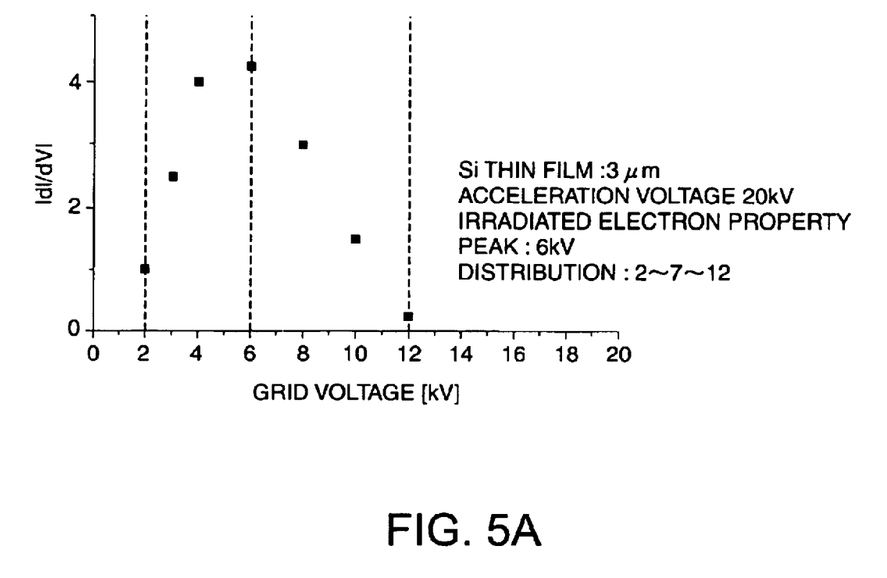
FIGS. 5A and 5B are graphs each showing a relationship of the voltage and a differential value of the sensor current shown in FIG. 4.
Figure 5B:
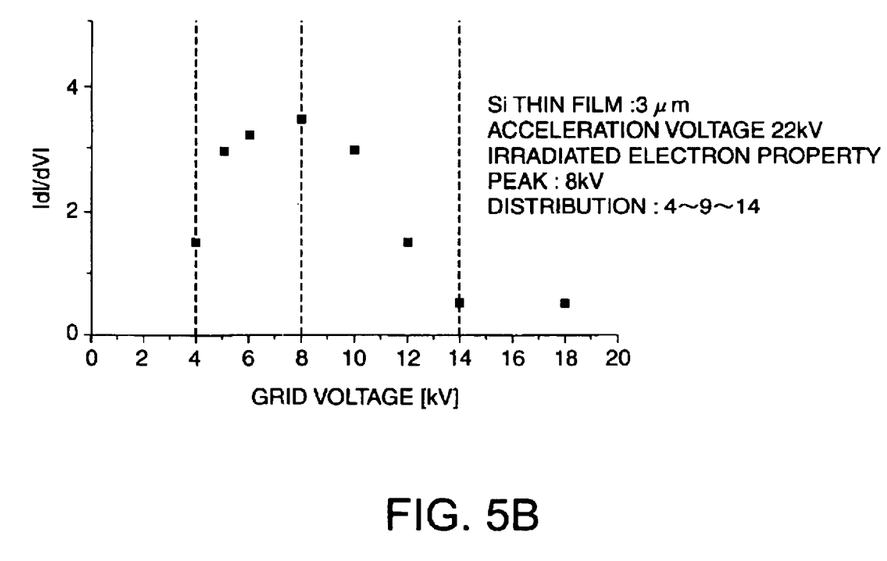

Actually, a relationship of the grid voltages and the sensor currents was measured. FIG. 4 shows the result. It was found that the results shown in FIG. 4 correspond to the graph of FIG. 3C. Among the results shown in FIG. 4, FIG. 5A shows a graph illustrating a change ratio (dI/dV) of the sensor current with respect to the grid voltage, when the voltage applied to the electron beam tubes 4 is 20 kV. Among the results shown in FIG. 4, FIG. 5B shows a graph illustrating a change ratio (dI/dV) of the sensor current with respect to the grid voltage, when the voltage applied to the electron beam tubes 4 is 22 kV. As apparent from FIGS. 5A and 5B, it was found that these graphs correspond to the energy distribution of electron shown in FIG. 3B. That is, the electric-current sensor 21 can surely capture the electron beams in a favorably reproductive manner, and thus can surely detect an amount of irradiation of the electron beams B. Therefore, the electric-current sensor 21 can be suitably used for detecting an end point of a film process.

Figure 6:
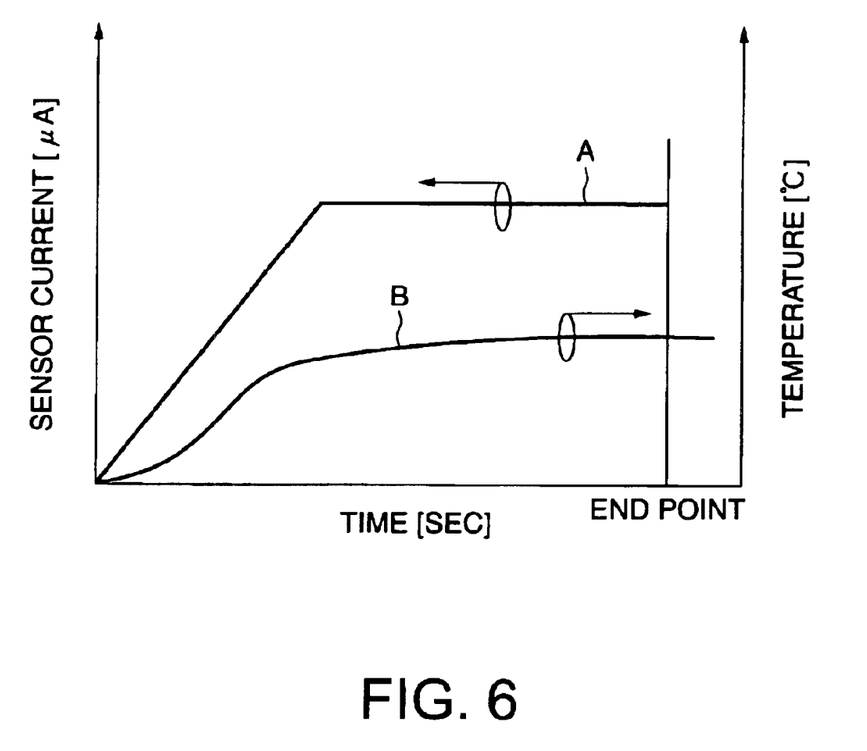
FIG. 6 is a graph showing a relationship of a process time, the sensor current, and a temperature of a stage, for illustrating a principal of detecting an end point.

In this way, when the electron beams are irradiated onto the SOD film on the wafer W, an amount of electron captured by the electric-current sensor 21 can be grasped as an electric-current value by means of the ammeter 22. As shown by the solid line A in FIG. 6, for example, the electric-current value rapidly increases and becomes stable at a certain value, under the control of the grid electrode 5. Then, an EB cure of the SOD film on the wafer W is carried out. An amount of incident electron by this time can be calculated by means of a time integration of the electric-current value. Under any given condition, there is a certain correlation of an amount of electron incident on the electric-current sensor 21 and an amount of electron incident on the SOD film on the wafer W. Thus, in this embodiment, an EB cure of a reference SOD film on a wafer W is previously conducted. When optimal modified qualities are obtained, the electron amount calculating unit 23 integrates an electric-current value detected by the electric-current sensor 21 by time. The integrated value functions as a reference amount of electron. The reference amount of electron is stored in the storing unit 26 of the controller 6. The reference amount of electron is sequentially compared with each amount of electron calculated by means of the electron amount calculating unit 23 when the actual wafer is processed, so that an end point of the EB cure of the SOD film on the actual wafer W is detected. The reference amount of electron depends on a film quality of, e.g., the SOD film on the wafer W. Thus, the reference amount of electron is calculated for each kind of films.

The EB cure is carried out by a combined action of the incident electron and heat. Thus, in order to detect the optimal end point of the EB cure, a time integration of temperature can be used. Then, an EB cure of a reference SOD film on a wafer W is previously carried out. Similarly to the case wherein the reference amount of electron is calculated, when the optimal modified qualities are obtained, the time integration unit 25 integrates a temperature detected by the temperature sensor 24 by time. The integrated value functions as a reference amount of heat (reference integrated temperature). The reference amount of heat is stored in the storing unit 26 of the controller 6. The reference amount of heat is sequentially compared with each amount of heat calculated by means of the time integration unit 25 when the actual wafer is processed. Then, it is possible to detect an end point of the EB cure of the SOD film on the actual wafer W as a timing at which an end point is detected not only based on the reference amount of electron but also based on the reference amount of heat. Alternatively, an end point may be determined by comparing a value obtained by multiplying the calculated amount of electron by the calculated amount of heat when the actual wafer W is processed, with a value obtained by multiplying the reference amount of electron by the reference amount of heat. That is, in this embodiment, in addition to quantitatively detecting an end point of the EB cure based on the reference amount of electron, the reference amount of heat is also used to detect the end point of the EB cure more accurately.

Figure 7:
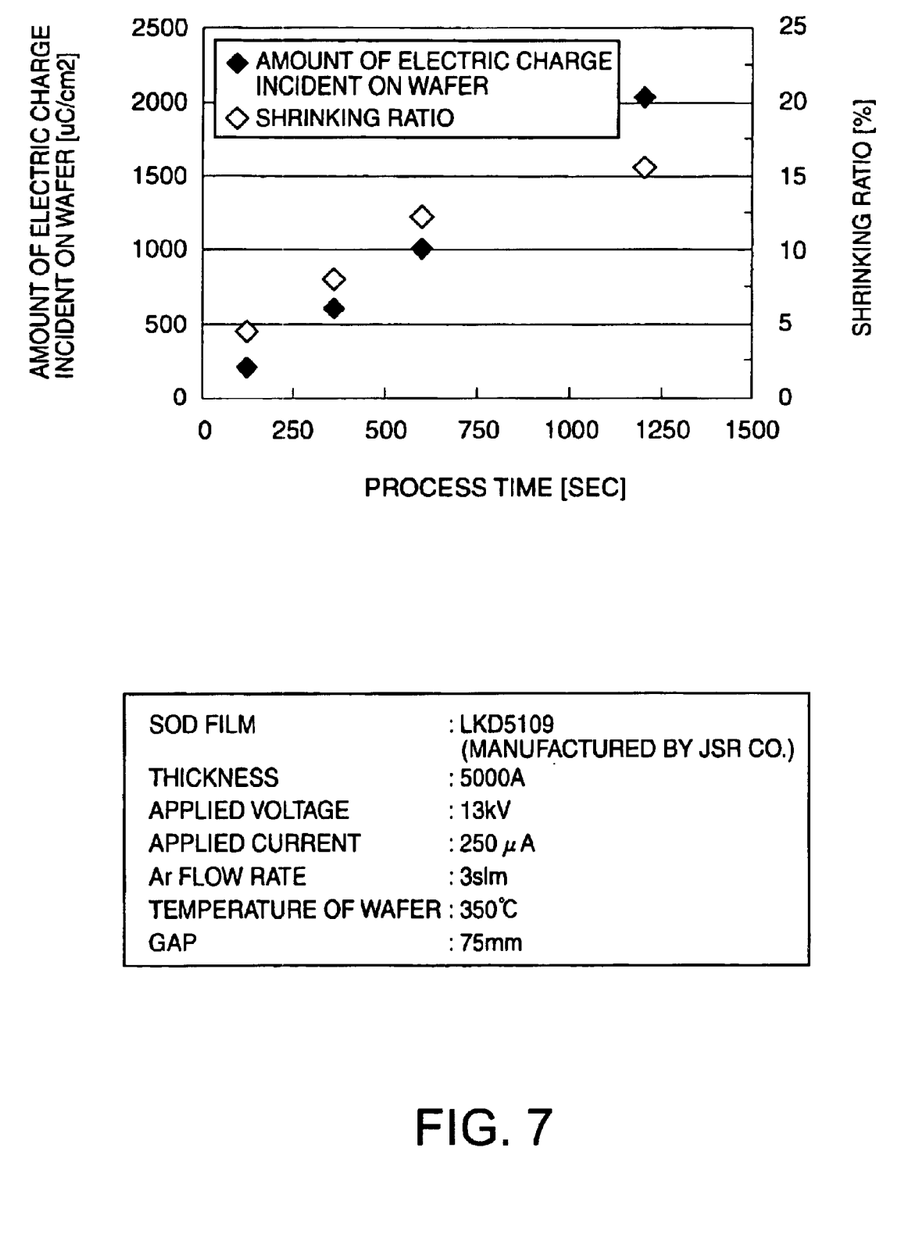
FIG. 7 is a view showing an example of the corresponding relationship of an amount of electric charge incident on a wafer, a shrinking ratio, and a process time.

In addition, the end point may be detected by using indications such as an amount of electric-charge incident on the wafer [$\mu c/cm^2$] and a shrinking ratio. The amount of electric-charge incident on the wafer is calculated as follows: an amount of electric-current detected by the electric-current sensor 21 is multiplied by the ratio of an electric-current sensor area with respect to a wafer area to obtain a total amount of electric-current incident on the wafer [$\mu c$] (calculated value). Then, the calculated value is divided by the wafer area to obtain the amount of electric-charge incident on the wafer. The shrinking ratio is a shrinking ratio of film thickness. FIG. 7 shows an example of corresponding relationship between these indications and process times. In the example shown in FIG. 7, as the process time elapses, the shrinking ratio increases and the measured/calculated amount of electric-charge incident on the wafer also increases. The shrinking ratio corresponds to a curing effect by means of the electron beams. Thus, based on a previously grasped correlation between the amount of electric-charge incident on the wafer and the shrinking ratio, a film process may be terminated when an amount of electric-charge incident on the wafer corresponding to a predetermined shrinking ratio is detected by monitoring the amount of electric-charge incident on the wafer during the film process.

When an EB cure is carried out to a film such as an SOD film, carbon ingredient is generally decreased at an area nearer to a surface of the film. Thus, a uniformity of film quality is degraded. If a film such as an SOD film is subjected to an etching or ashing process, conditions of the etching or ashing process are different according to depth of the film, so that a shape of the film after the etching or ashing process may be deteriorated, or the etching rate may be lowered. Further, the film may be etched by a cleaning liquid or the like. Thus, when an SOD film is applied on a wafer W, the applying step is divided into a plurality of steps. In the respective steps, application materials are step by step applied onto the wafer in ascending order of carbon concentration. Thus, an inclination of carbon concentration is provided in a direction of depth of the SOD film. As a result, the carbon concentration is higher in the higher layer. Since the inclination of carbon concentration is provided in the depth direction, even if the carbon concentration in a surface layer of the SOD film is lowered by the EB cure, the carbon concentration in the depth direction of the SOD film becomes substantially uniform upon termination of the EB cure, because the carbon concentration in the surface layer is made previously higher. Accordingly, the above disadvantages can be eliminated.

Next, a method of detecting an end point of a film process conducted by the electron beam processing apparatus 1 of this embodiment is described below. When an EB cure of an SOD film on a wafer W is carried out, the wafer W is transferred to the electron beam processing apparatus 1 by means of a wafer transfer arm (not shown). Then, the gate valve 9 is opened, and the wafer W is transferred by the wafer transfer arm through the port 2A into the processing container 2, and is delivered onto the stage 3 waiting in the processing container 2. Thereafter, the wafer transfer arm is withdrawn from the processing container 2, and the gate valve 9 is closed in order to air-tightly seal the processing container 2. During this step, the stage 3 is elevated up by the elevating mechanism 7, so that a gap between the wafer W and the electron beam tubes 4 is maintained at a predetermined distance.

After that, air in the processing container 2 is evacuated by the vacuum exhaust system, and an inert gas such as Ar or $N_2$ is supplied into the processing container 2 from the gas supply source. In this way, the air in the processing container 2 is replaced with the inert gas. In addition, a pressure of the inert gas in the processing container 2 is held at a predetermined one. At this time, the heater of the stage 3 is actuated to heat the wafer W to hold the same at a predetermined temperature. Under this condition, a predetermined voltage is applied to all the electron beam tubes 4. Thus, as shown in FIG. 3B, electron beams B of a certain energy distribution are irradiated from the respective electron beam tubes 4 onto the wafer W. Then, the EB cure of the SOD film is initiated, while an amount of irradiation of the electron beams is controlled by the grid electrode 5.

Electrons passing through the grid electrode 5 are incident on the SOD film on the wafer W or on the electric-current sensor 21. The ammeter 22 measures the electrons captured by the electric-current sensor 21 as an electric-current value. The measured value is outputted to the controller 6. In the controller 6, after the value measured by the ammeter 22 is A/D converted, the electron amount calculating unit 23 integrates the electric-current value by time to calculate an amount of electron. At the same time, the temperature sensor 24 measures a temperature of the stage 3. Similarly to calculating an amount of electron, the time integration unit 25 integrates a measured temperature by time to calculate an integrated temperature (an amount of heat).

The controller 6 sequentially compares the amount of electron calculated by the electron amount calculating unit 23 with the reference amount of electron. When the calculated amount of electron reaches the reference amount of electron, the controller 6 judges that the EB cure reaches an end point. Then, a control signal is outputted to stop the irradiation of the electron beams B so as to terminate the EB cure. Alternatively, if the integrated temperature (the amount of heat) calculated by the time integration unit 25 does not reach the reference integrated temperature (the reference amount of heat), the EB cure may be continued until the integrated temperature reaches the reference integrated temperature.

As described above, according to this embodiment, the electron beams B are captured by the electric-current sensor 21 in a vicinity of the wafer W, an amount of electron captured by the electric-current sensor 21 is measured by the ammeter 22 as an electric-current value, the electron amount calculating unit 23 integrates the measured value by time to obtain an amount of electron, and an end point of the EB cure is detected based on the amount of electron. Thus, the electron beams are suitably irradiated onto a film such as an SOD film on the wafer W, so that the optimal EB cure may be constantly carried out. That is, a suitable film quality having a desired k value can be obtained.

In addition, according to this embodiment, a reference amount of electron captured by an end point of an EB cure of a reference film on a wafer W is previously calculated, and an end point of an EB cure is detected based on the reference amount of electron. Thus, an end point of an EB cure for achieving a suitable film quality can be surely detected, and the EB cure can be automatically terminated in real time. At that time, a temperature of the stage 3 is measured to detect an end point based on an integrated temperature of the measured value. Thus, the end point of the EB cure can be more accurately detected. A provision of the grid electrode 5 allows an amount of irradiation of the electron beams B to be more securely controlled.

Figure 8:
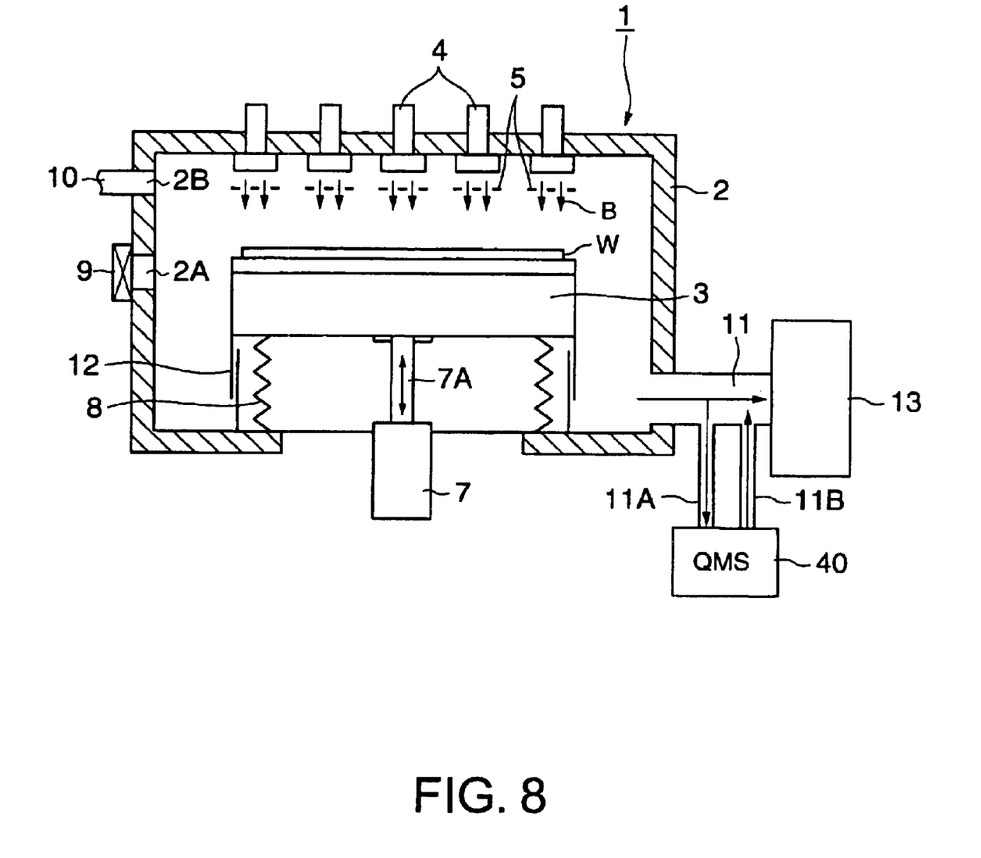
FIG. 8 is a cross-sectional view schematically showing another embodiment of a film-processing apparatus according to the present invention.
Figure 9:
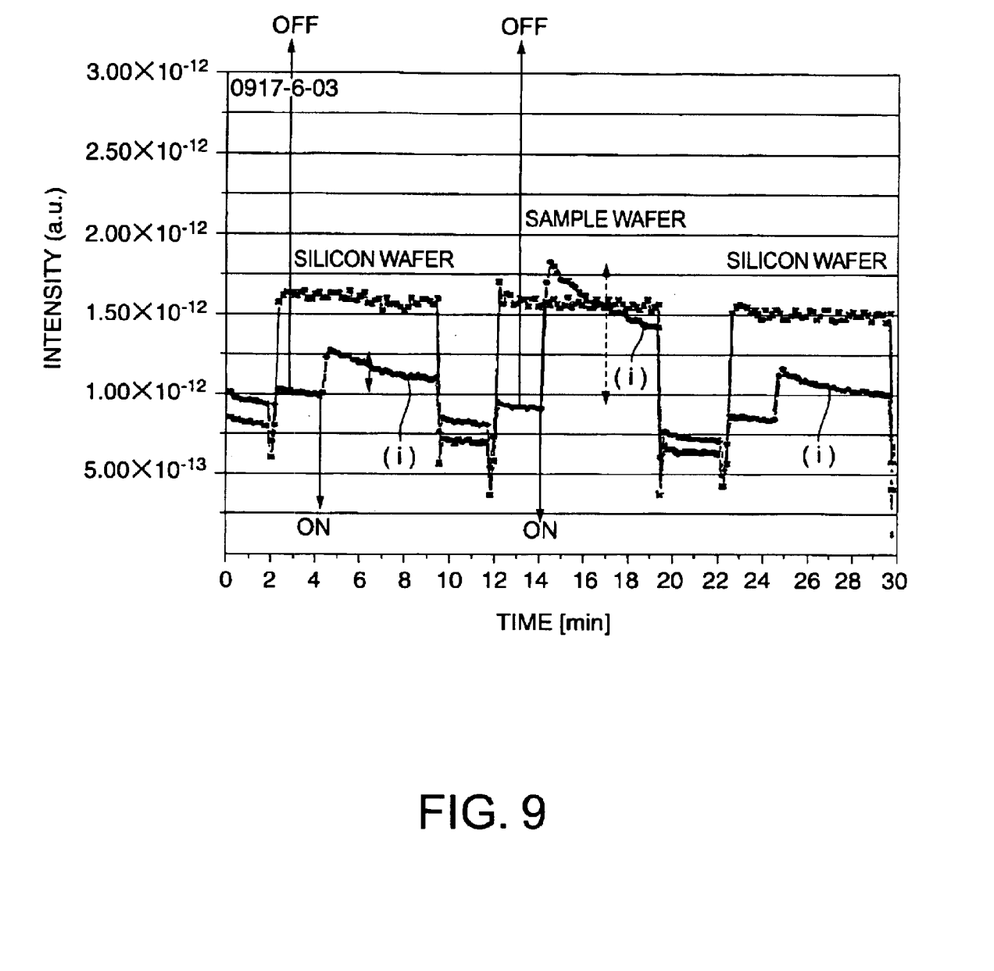
FIG. 9 is a graph illustrating a principal of detecting an end point by using the film-processing apparatus shown in FIG. 8.

Next, other methods of detecting an end point and apparatuses for the same are described with reference to FIGS. 8 to 12, wherein the same parts have the same reference numbers, and characteristic features thereof are mainly described. FIGS. 8 and 9 show an apparatus for detecting an end point of an EB cure by quantitatively analyzing a certain gas by using a gas analyzing unit such as a Fourier transform infrared spectroscopic analyzing (FT-IR) unit or a mass analyzing unit.

An electron beam processing apparatus 1 shown in FIG. 8 includes a processing container 2, a stage 3, electron beam tubes 4, and a grid electrode 5. The parts other than an end point detecting unit are constituted in substantially the same manner as the above embodiment. A vacuum exhaust system 13 is connected to the processing container 2 through a gas exhaust pipe 11. A gas inlet pipe 11A and a gas outlet pipe 11B are connected to the gas exhaust pipe 11. An end point detecting unit 40 is connected to the gas exhaust pipe 11 through the pipes 11A and 11B. The end point detecting unit is, for example, composed of a mass analyzing unit, an FT-IR unit, and so on. In this embodiment, a mass analyzing unit 40 is used.

When a gas is detached from an SOD film on a wafer W by an EB cure, the detached gas is discharged from the processing container 2 to the gas exhaust pipe 11. The discharged gas is introduced from the gas inlet pipe 11A into the mass analyzing unit 40 to analyze gas ingredients thereof. The analyzed gas is led out from the gas outlet pipe 11B to the gas exhaust pipe 11. For example, when an EB cure is carried out to an SOD film on a surface of a wafer W, an energy of electron incident on the SOD film causes a chemical reaction such as a polycondensation reaction. Then, water, hydrogen gas, and so on are detached from the SOD film. The mass analyzing unit 40 sequentially determines respective quantities of the gas ingredients of the detached gas. That is, the gas ingredients of the detached gas are monitored while the EB cure is carried out. Therefore, an end point of the EB cure can be detected, i.e., the same effect as the above embodiment can be expected.

FIG. 9 is a graph illustrating a relationship between process times of an EB cure and concentration (intensity) of respective gas ingredients, wherein a sample wafer coated with an SOD film and a silicon wafer without an SOD film are sequentially subjected to the EB cure. The reference character (i) indicates an intensity of hydrogen gas. As apparent from FIG. 9, the intensity of hydrogen gas (amount of hydrogen gas) detached from the SOD film decreases as the time elapses. Thus, the intensity of hydrogen gas may be used as an indication for detecting an end point. An intensity of hydrogen gas before a suitable EB cure to the SOD film is completed is previously integrated by time, and the integrated value is used as a reference value for judging an end point. When an EB cure of an actual wafer is carried out, an integrated value of intensity during the EB cure and the reference value are compared with each other, which is similar to the above cases. A timing at which the integrated value of intensity reaches the reference value is judged as an end point of the EB cure. Accordingly, the same effect as the above embodiment can also be expected. The result shown in FIG. 9 was obtained when the EB cure was carried out under the following conditions.

[Conditions of EB Cure]
Temperature of Wafer: 350° C.
Inert Gas: Ar (10 Torr, 3L/min)
Electron Beam Tube
  Applied Voltage: 13 kV
  Tube Current: 170 $\mu$A
Process Time: 5 minutes When the mass analyzing unit 40 is used, an end point of the EB cure can be detected as described above. However, by analyzing the detached gas, gas ingredients, which may be deposited on an inner surface of the processing container 2, can be otherwise grasped, for example. By determining respective quantities of the gas ingredients, thickness of a film deposited on the inner surface can be estimated. Based on the thickness, a timing suitable for cleaning the interior of the processing container 2 can be estimated. In addition, by analyzing oxygen gas, it is possible to monitor whether any gas leaks from the processing container 2 or not.

Figure 10:
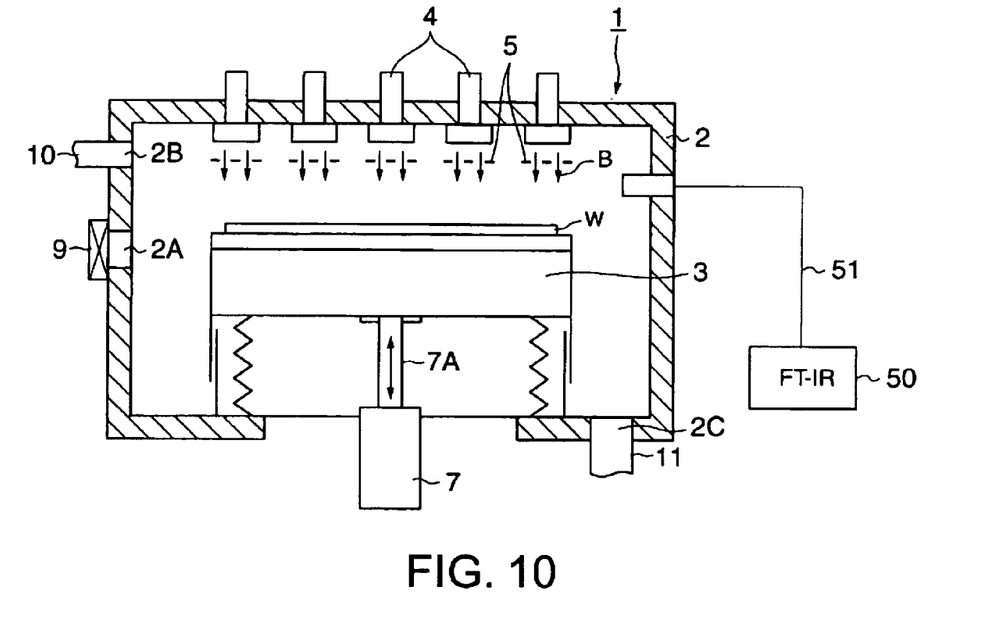
FIG. 10 is a cross-sectional view schematically showing another embodiment of a film-processing apparatus according to the present invention.

An irradiation of electron beams onto an SOD film causes a polycondensation reaction, and then water molecules are detached from the SOD film. As shown in FIG. 10, an FT-IR unit is used to determine quantity of the water molecules. The determined value is integrated by time, and thus an end point of the EB cure can be detected similarly to the above embodiments. In FIG. 10, the FT-IR unit 50 is connected to the processing container 2 through a pipe 51. Water molecules (vapor) floating above the wafer W are taken out from the pipe 51, and the FT-IR unit 50 measures an intensity of infrared absorption by hydrogen-oxygen bonding in the water molecules. By means of a time integration of the absorption intensity, an end point of the EB cure can be detected. Naturally in this case, a gas analyzing unit such as a mass analyzing unit can be used as an end point detecting unit.

Figure 11:
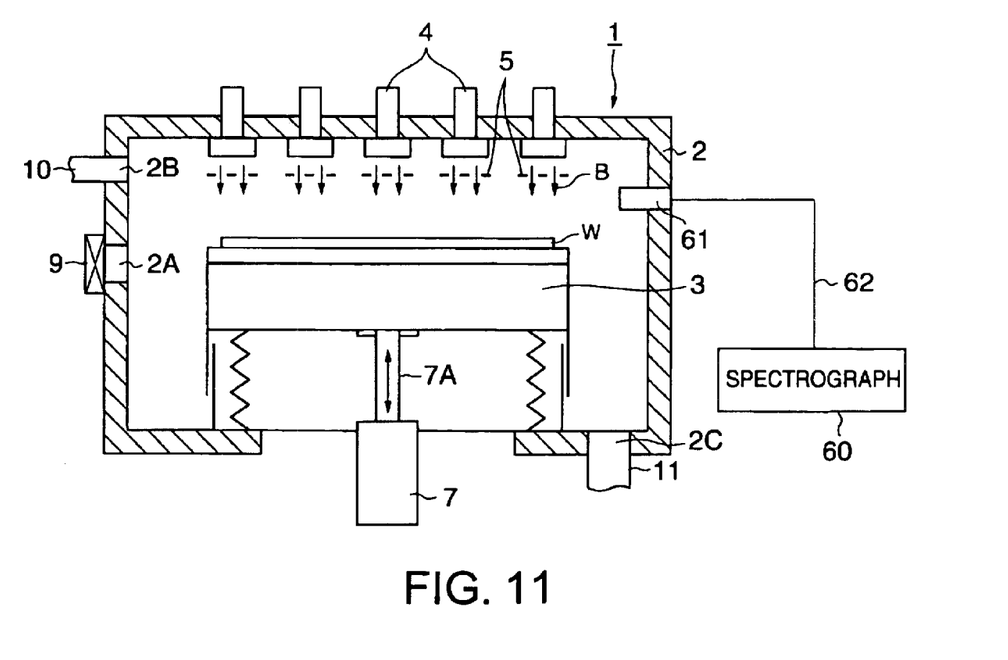
FIG. 11 is a cross-sectional view schematically showing another embodiment of a film-processing apparatus according to the present invention.

Further, by using an emission spectroscopy analysis as well, an end point of an EB cure can be detected. As shown in FIG. 11, a collimator 61, for example, is attached on an upper part of the peripheral surface of the processing container 2. A spectrograph 60 is connected to the collimator 61 through an optical fiber 62. An emission spectrum taken by the collimator 61 and the optical fiber 62 is generated by the spectrograph 60 so as to measure an intensity of the emission spectrum with respect to a certain wavelength of a plasma corresponding to a certain detached gas (e.g., hydrogen radical). Then, the emission intensity is integrated by time. Based on the integrated value, an end point of the EB cure is detected. Also in this case, an integrated value as a reference value is previously calculated by using a reference wafer. By comparing an integrated value obtained while an actual wafer is subjected to an EB cure and the reference value with each other, an end point of the EB cure can be detected. Thus, the same effect as the above respective embodiments can be expected.

Alternatively, an end point of an EB cure can be detected by utilizing a refractive index of an SOD film on a surface of a wafer W. During the EB cure of the SOD film on the wafer W, activation energy is imparted to organic compounds forming the SOD film by electron incident on the SOD film from the electron beam tubes. Then, a polycondensation reaction or the like occurs to generate a gas. As a result, the SOD film is shrunk and cured. A refractive index of the SOD film is changed according to the shrinking of the SOD film. Thus, an end point of the EB cure can be detected based on a relationship between the refractive index and the shrinking ratio of the SOD film. Also in this case, the same effect as the above respective embodiments can be expected.

Figure 12:
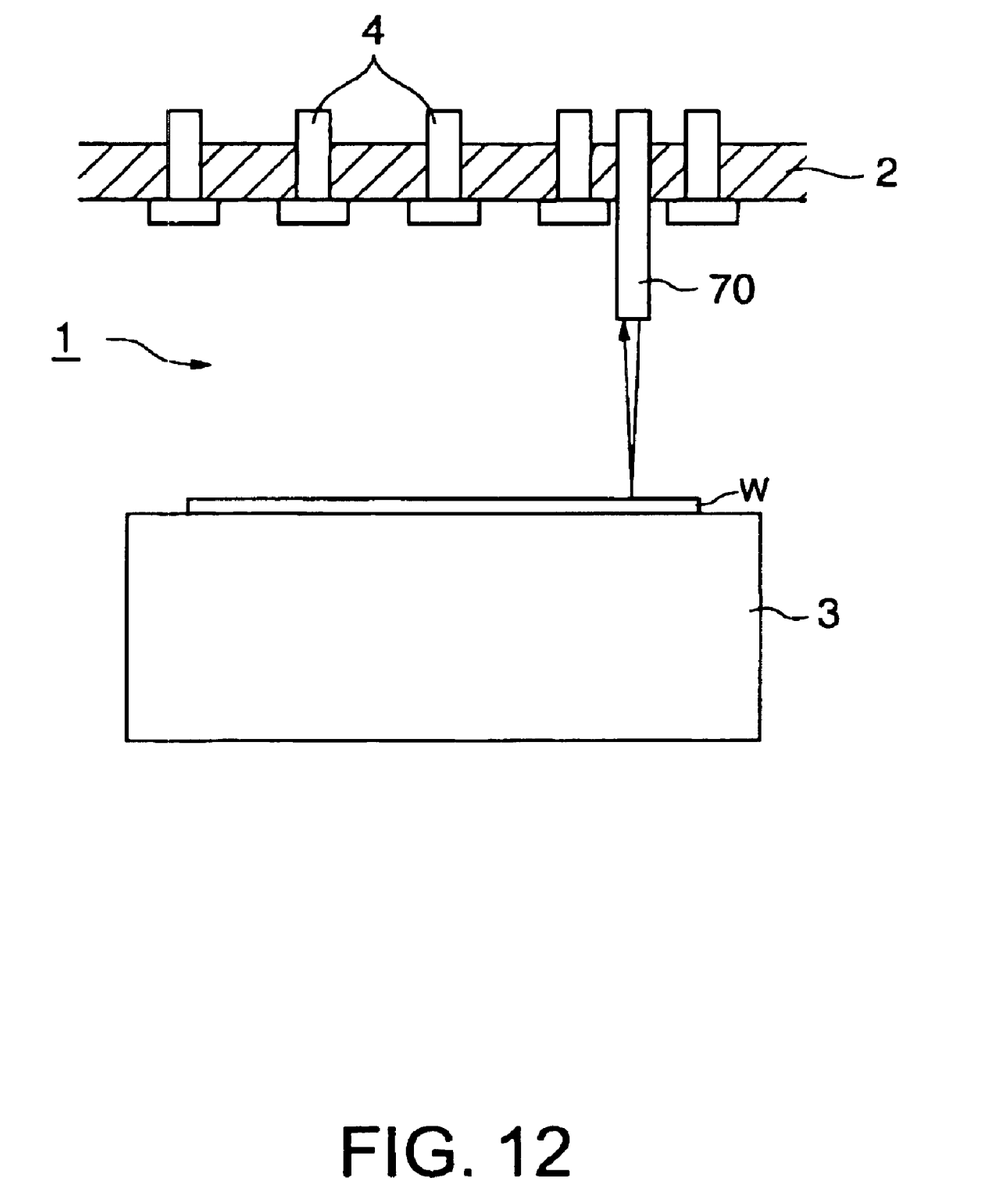
FIG. 12 is a cross-sectional view schematically showing another embodiment of a film-processing apparatus according to the present invention.
Figure 13:
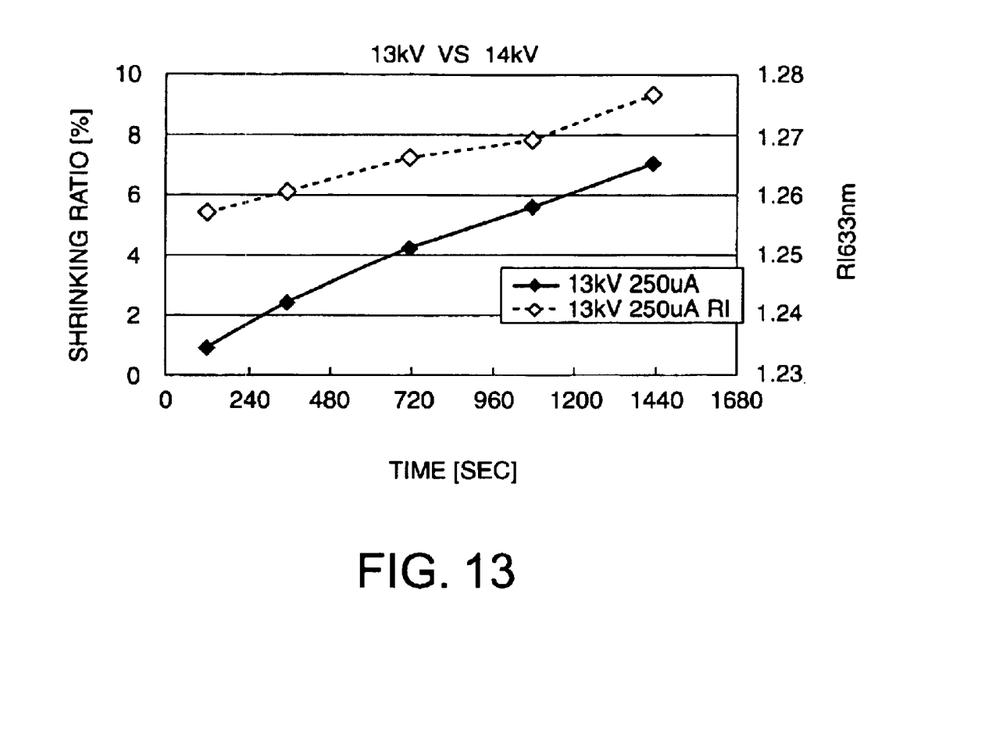
FIG. 13 is a graph illustrating a principal of detecting an end point by using the film-processing apparatus shown in FIG. 12.

In the electron beam processing apparatus 1 shown in FIG. 12, a refractive index measuring unit (e.g., a spectral ellipsometer using a single wavelength) 70, for example, is attached on an upper surface of the processing container 2. The refractive index measuring unit 70 measures a refractive index of the SOD film. Other parts are constituted in substantially the same manner as those of the respective above electron beam processing apparatuses 1. FIG. 13 shows a relationship between process times of the EB cure, shrinking ratios of the SOD film, and refractive indices (RI) of the same, wherein the EB cure was carried out by the electron beam processing apparatus 1 under the conditions described below. A single wavelength of 633 nm was used to measure the refractive indices. As shown in FIG. 13, both the shrinking ratio and the refractive index increase substantially in proportion with a lapse of the process time. In detecting an end point of the EB cure, a refractive index before a suitable EB cure to a reference wafer is completed is previously integrated by time, and the integrated value is used as a reference value for judging an end point. When an actual wafer W is subjected to an EB cure, a refractive index is integrated by time, and a timing at which the integrated value reaches the reference value is judged as an end point of the EB cure. Also in this case, the same effect as the above respective embodiments can be expected.

[Conditions of EB Cure]
Pressure in Processing Container: 10 Torr
Temperature of Wafer: 350° C.
Argon Gas: 3 L/min under normal state Electron Beam Tube
  Applied Voltage: 13 kV
  Tube Current: 260 µA As described above, the EB cure is affected by a temperature of the wafer. Thus, an influence given to the SOD film by the temperature during the EB cure was investigated, while keeping the process time constant but changing the tube current of the electron beam tubes 4. It was found that, the higher the tube current is and the higher the temperature is, the higher the shrinking ratio and hardness (elastic modulus) become. When keeping the tube current constant but changing the process time, substantially the same result was obtained.

Figure 14:
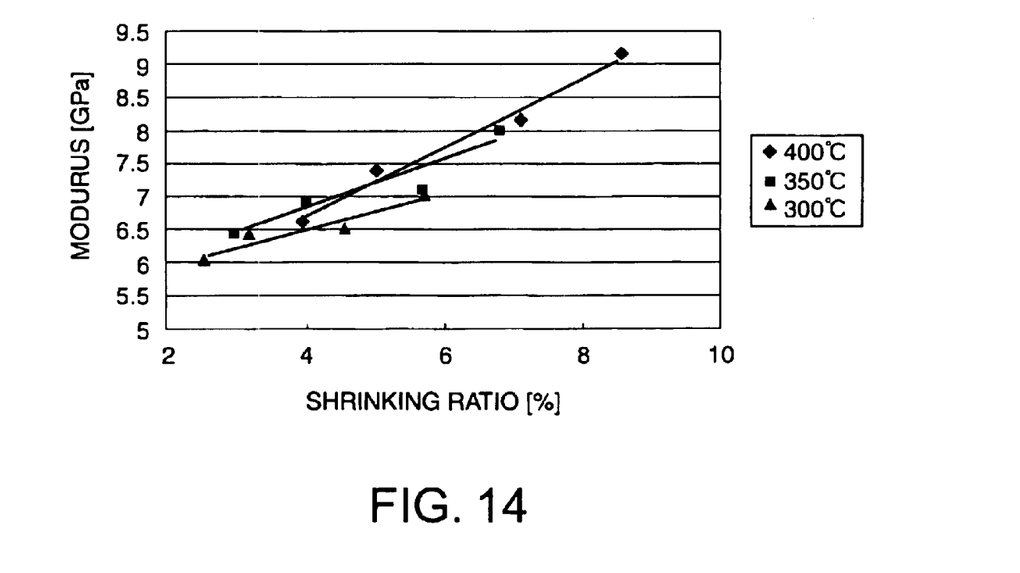
FIG. 14 is a graph illustrating the principal of detecting an end point by using the film-processing apparatus shown in FIG. 12.

FIG. 14 shows a correlation of shrinking ratios and elastic moduli. Herein, a correlation of shrinking ratios and elastic moduli of the SOD film is shown in which the EB cures are carried out with various temperatures of the wafer. As apparent from FIG. 14, the higher a temperature of the wafer is, the sharper a gradient of the elastic modulus with respect to the shrinking ratio becomes. In addition, it was found that, in the same shrinking ratio, when a temperature of the wafer is different, the elastic modulus is also different. In this way, a relationship between the shrinking ratio and the elastic modulus depends on a temperature of the wafer. Thus, when detecting an end point of the EB cure based on a refractive index of the SOD film so as to obtain a required elastic modulus of the SOD film, the end point of the EB cure can be detected more accurately if an integrated temperature of a temperature of the wafer is taken into consideration. Also in this case, the same effect as the above respective embodiments can be expected.

In place of the refractive index measuring unit 70, an optical interference thickness meter can be attached to the processing apparatus to detect a change of film thickness. An end point of an EB cure can be detected by using the optical interference thickness meter. During the EB cure to the SOD film, the SOD film is shrunk so that the film thickness thereof is gradually decreased as the time elapses. By detecting the change of the film thickness by means of the optical interference thickness meter, an end point of the EB cure is detected. Similarly to the above embodiment, the end point can be detected more accurately if an integrated temperature of a temperature of the wafer is taken into consideration.

Although not shown, a weight detecting unit may be disposed on the stage so that a weight of the wafer may be detected by the same. In this case, a weight of a reference wafer when a suitable EB cure to the reference wafer is completed is previously stored in the storing unit as a reference weight. When an actual wafer is subjected to an EB cure, a weight of the wafer is sequentially detected. A timing at which a weight of the wafer reaches the reference weight is judged as an end point of the EB cure.

Figure 15A:
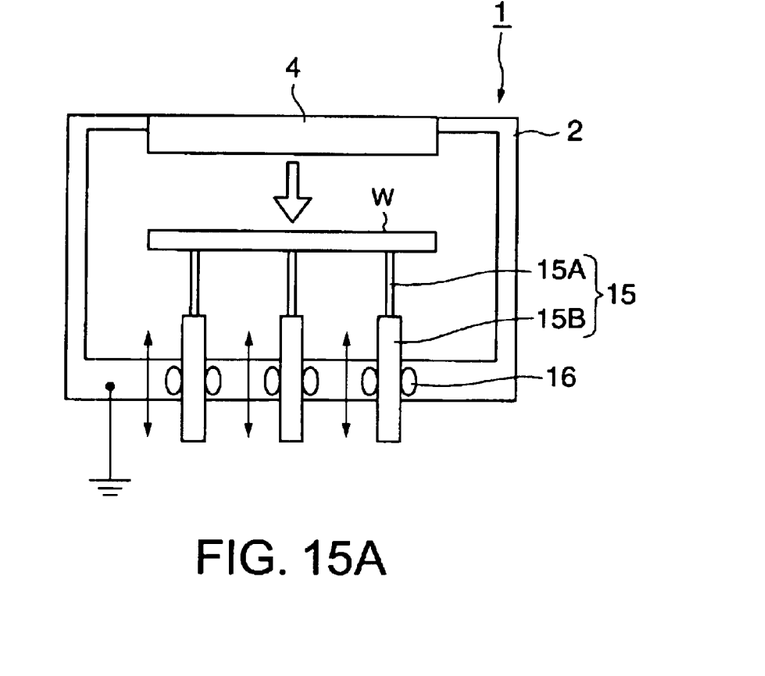
FIG. 15A is a view schematically showing an elevating mechanism of a wafer W used in an improved film-processing apparatus.
Figure 15B:
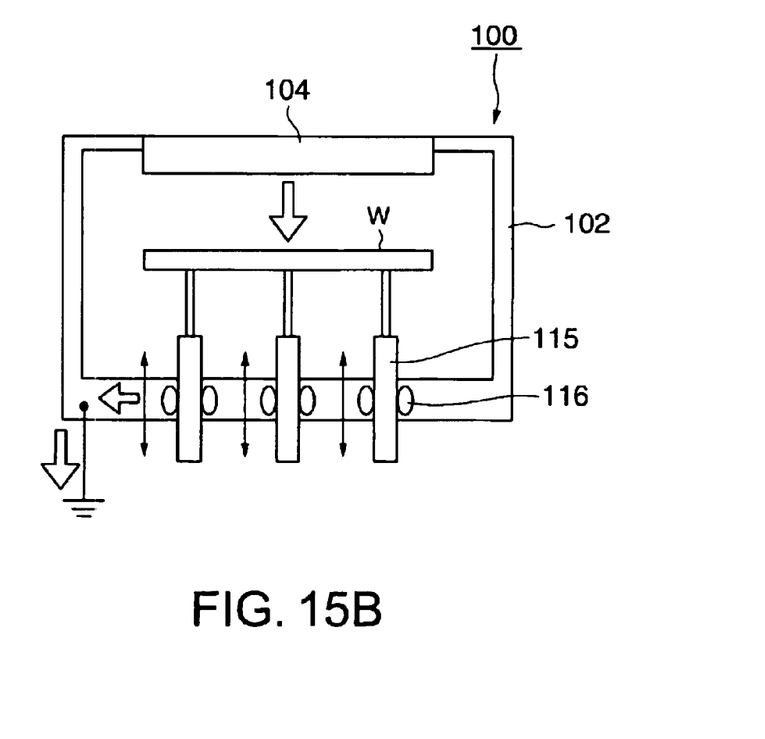
FIG. 15B is a view schematically showing an elevating mechanism of a wafer W used in a conventional film-processing apparatus.

FIGS. 15A and 15B schematically show the elevating mechanism for the wafer W, which is used in the electron beam processing apparatus. As shown in FIG. 15A, each electron beam apparatus 1 in the above respective embodiments has a plurality of (e.g., three) elevating pins 15 arranged on the bottom surface of the processing container 2. As indicated by the arrow in FIG. 15A, the elevating pins 15 are vertically moved when the wafer W is delivered to an outer wafer-conveying mechanism and received therefrom. Each elevating pin 15 is composed of, for example, a pin portion 15A and a support portion 15B which is integrally formed with the pin portion 15A. As shown in FIG. 15A, the support portion 15B passes through a bottom of the processing container 2 in a vertically movable manner via an O-ring 16.

The pin portion 15A is formed by, e.g., depositing ceramics such as alumina on a surface of a metal such as stainless steel. The support portion 15B is formed of a metal such as stainless steel or the like. A deposition of the ceramics on the pin portion 15A insulates the elevating pin 15 from a ground electric potential. This prevents an electric discharge when the electron beams are irradiated. In order to air-tightly seal the support portion 15B, the support portion 15B is processed from a metal material with high precision and the O-ring 16 is used therefor. The pin portion 15A may be naturally coated with any other insulating material than ceramics. Alternatively, the pin portion 15A itself may be formed of an insulating material such as ceramics. Since the elevating pin 15 has such a constitution, measures against an electric discharge can be taken, while employing a vacuum sealing constitution of the processing container 2. As a result, the EB cure can be surely and favorably carried out. In addition, it is possible to reduce a cost for finishing a surface of the elevating pin 15 (abutting surface with the O-ring 16) with a desired processing precision. The elevating pin 15 may be disposed on the stage 3 of the electron beam processing apparatus 1.

On the other hand, in a conventional electron beam processing apparatus 100 shown in FIG. 15B, an elevating pin 115 is formed of a metal such as stainless steel. Thus, the elevating pin 115 is in a ground electric potential. Therefore, an electric discharge may occur through the elevating pin 115 when the electron beams are irradiated. An electric current may flow in a direction shown by the outline arrow in FIG. 15B, which may badly affect the EB cure. In FIG. 15B, the reference numbers 102, 104, and 116 respectively indicate a processing container, an electron beam tube, and an O-ring.

The present invention is not limited to the above embodiments. Various changes and modifications are included in the present invention without departing from the scope of the invention. For example, in the above embodiments, a temperature of the stage 3 is measured, and the measured temperature is used as a temperature of the wafer W. However, a temperature of the wafer W may be directly measured. In this case, an end point can be more accurately detected. Further, although the grid electrode 5 is provided in the above embodiments, the present invention can be also applied to cases without grid electrode.

What is claimed is:

1. A film-processing method comprising:
   a processing step of irradiating electron beams onto a film on a surface of an object to be processed to modify a quality of the film;
   an electric-current measuring step of capturing the electron beams in a vicinity of the object to be processed to measure an electric-current value during the processing step; and
   a detecting step of detecting an end point of the process to the film, based on a time integration of the electric-current value.

2. A film-processing method according to claim 1, wherein
   an amount of irradiation of the electron beams onto the film is controlled by a grid electrode during the processing step.

3. A film-processing method according to claim 1, further comprising:
   a calculating step of previously calculating a number of electrons captured before an end point of a process to a reference film on an object to be processed, as a reference number of electrons; wherein the detecting process detects the end point of the process to the film, based on the reference number of electrons.

4. A film-processing method according to claim 1, wherein the detecting step further detects the end point of the process to the film, based on a temperature of a holding member which holds the object to be processed, or a temperature of the object to be processed.

5. A film processing method according to claim 4, wherein the detecting step further detects the end point of the process to the film, based on an integrated temperature obtained by time integration of a temperature of a holding member which holds the object to be processed, or an integrated temperature obtained by time integration of a temperature of the object to be processed.

6. A film processing method according to claim 4, wherein an amount of irradiation of the electron beams onto the film is controlled by a grid electrode during the processing step.

7. A film processing method according to claim 4, further comprising:

a calculating step of previously calculating an integrated temperature integrated before an end point of a process to a reference film on an object to be processed, as a reference integrated temperature; wherein the detecting process detects the end point of the process to the film, based on the reference integrated temperature.

8. A film processing method according to claim 1, wherein the detecting step further detects the end point of the process to the film, based on an integrated temperature obtained by time integration of a temperature of a holding member which holds the object to be processed, or an integrated temperature obtained by time integration of a temperature of the object to be processed.

9. A film-processing apparatus comprising:

a processing unit which irradiates electron beams onto a film on a surface of an object to be processed to modify a quality of the film;

an electric-current sensor which captures the electron beams as an electric-current in a vicinity of the object to be processed;

an electric-current measuring unit which measures an electric-current value of the electric-current captured by the electric-current sensor;

a calculating unit which calculates by time integration of the electric-current value; and a detecting unit which detects an end point of the process to the film, based on the time integration of the electric-current value.

10. A film-processing apparatus according to claim 9, further comprising:

a grid electrode which controls an amount of irradiation of the electron beams onto the film.

11. A film-processing apparatus according to claim 9, further comprising:

a storing unit which stores a reference number of electrons captured before an end point of a process to a reference film on an object to be processed; wherein the detecting unit is adapted to detect the end point of the process to the film, based on the reference number of electrons.

12. A film-processing apparatus according to claim 9, wherein the detecting unit is further adapted to detect the end point of the process to the film, based on a temperature of a holding member which holds the object to be processed, or a temperature of the object to be processed.

13. A film processing apparatus according to claim 12, wherein the detecting unit is further adapted to detect the end point of the process to the film, based on an integrated temperature obtained by time integration of a temperature of a holding member which holds the object to be processed, or an integrated temperature obtained by time integration of a temperature of the object to be processed.

14. A film processing apparatus according to claim 12, further comprising:

a grid electrode which controls an amount of irradiation of the electron beams onto the film.

15. A film processing apparatus according to claim 12, further comprising:

a storing unit which stores a reference integrated temperature integrated before an end point of a process to a reference film on an object to be processed;

wherein the detecting unit is adapted to detect the end point of the process to the film, based on the reference integrated temperature.

16. A film-processing apparatus according to claim 9, further comprising:

a processing container;

a stage disposed in the processing container; and a plurality of electron beam tubes which irradiate electron beams onto an object to be processed mounted on the stage.

17. A film processing apparatus according to claim 9, wherein the detecting unit is further adapted to detect the end point of the process to the film, based on an integrated temperature obtained by time integration of a temperature of a holding member which holds the object to be processed, or an integrated temperature obtained by time integration of a temperature of the object to be processed.

* * * * *